United States Patent [19]

Beach

[11] Patent Number: 5,646,425

[45] Date of Patent: Jul. 8, 1997

[54] SUPERSATURATED RARE EARTH DOPED SEMICONDUCTOR LAYERS BY CHEMICAL VAPOR DEPOSITION

[75] Inventor: David Bruce Beach, Yorktown Heights, N.Y.

[73] Assignee: International Business Machines Corporation, Armonk, N.Y.

[21] Appl. No.: 468,367

[22] Filed: Jun. 6, 1995

Related U.S. Application Data

[62] Division of Ser. No. 207,942, Mar. 9, 1994, Pat. No. 5,534,079, which is a division of Ser. No. 940,416, Aug. 31, 1992, Pat. No. 5,322,813.

[51] Int. Cl.$^6$ .................................................. H01L 33/00
[52] U.S. Cl. ............................. 257/102; 257/103; 372/43
[58] Field of Search ............................. 372/43; 385/142; 257/102, 103

[56] References Cited

U.S. PATENT DOCUMENTS

| | | | |
|---|---|---|---|
| 4,385,946 | 5/1983 | Finegan et al. | 148/175 |
| 4,618,381 | 10/1986 | Sato et al. | 148/189 |
| 4,800,173 | 1/1989 | Kanai et al. | 37/81 |
| 5,082,798 | 1/1992 | Arimoto | 437/108 |
| 5,107,538 | 4/1992 | Benton et al. | 385/130 |
| 5,119,460 | 6/1992 | Bruce et al. | 385/142 |
| 5,248,890 | 9/1993 | Luth et al. | 257/102 |

FOREIGN PATENT DOCUMENTS

| | | |
|---|---|---|
| 0286626A1 | 10/1988 | European Pat. Off. . |
| 3319134A1 | 5/1985 | Germany . |

OTHER PUBLICATIONS

Patek, *Glass Lasers*, (Butterworth, London 1970), p. 105.

Applied Physics Letter 43 (10), Nov. 1983 p. 943 H. Ennen, J. Schneider, G. Pomrenke, and A. Axmann "1.54–μm luminescence of erbium–implanted III–V semiconductors and silicon".

Applied Physics Letter 46 (4), Feb. 1985 p. 381 H. Ennen, G. Pomrenke, A. Axmann, K. Eisele, W. Haydl, and J. Schneider "1.54–μm electroluminesence of erbium–doped silicon grown by molecular beam epitaxy".

Applied Physics Letter 50 (2), Jan. 1987 p. 113 B.S. Meyerson, F.K. LeGoues, T.N. Nguyen, and D.L. Harame "Nonequilibrium boron doping effects in low–temperature epitaxial silicon films".

Japanese Journal of Applied Physics vol. 29, No. 4, Apr. 1990, pp. L524–L526 P.N. Favennec, H. L'Haridon, D. Moutonnet, M. Salvi and M. Gauneau "Optical Activation of $Er^{3+}$ Implanted in Silicon by Oxygen Impurities".

Applied Physics letter 58 (24), Jun. 1991 p. 2797 D.J. Eaglesham, J. Michel, E.A. Fitzgerald, D.C. Jacobson, J.M. Poate, J.L. Benton, A. Polman, Y.–H. Xie, and L.C. Kimerling "Microstructure of erbium–implanted Si".

J. Applied Physics 70 (5), Sep. 1991 p. 2667 J.L. Benton, J. Michel, L. C. Kimerling, D.C. Jacobson, Y. –H. Xie, D.J. Eaglesham, E.A. Fitzgerald, and J.M. Poate "The electrical and defect properties of erbium–implanted silicon".

J. Applied Physics 70 (5), Sep. 1991 p. 2672 J. Michel, J.L. Benton, R.F. Ferrante, D.C. Jacobson, D.J. Eaglesham, E.A. Fitzgerald, Y.–H. Xie, J.M. Poate, and L.C. Kimerling "Impurity enhancement of the 1.54–μm $Er^{3+}$ luminescence in silicon".

(List continued on next page.)

*Primary Examiner*—Jerome Jackson
*Assistant Examiner*—Nathan K. Kelley
*Attorney, Agent, or Firm*—Heslin & Rothenberg, P.C.

[57] ABSTRACT

A CVD process for producing a rare earth–doped, epitaxial semiconductor layer on a substrate is disclosed. The process utilizes a silane or germane and a rare earth compound in the gas phase. By this method single phase, rare earth–doped semiconductor layers, supersaturated in the rare earth, are produced. The preferred rare earth is erbium and the preferred precursors for depositing erbium by CVD are erbium hexafluoroacetylacetonate, acetylacetonate, tetramethylheptanedionate and flurooctanedionate. The process may be used to produce optoelectronic devices comprising a silicon substrate and an erbium–doped epitaxial silicon film.

5 Claims, 3 Drawing Sheets

OTHER PUBLICATIONS

Journal of Crystal Growth 104 (1990) pp. 815–819 J. Weber, M. Moser, A. Stapor, F. Scholz, G. Bohnert, A. Hangleiter, A. Hammel, D. Wiedmann, and J. Weidlein "Movpe Grown InP:Er Layers Using $Er(MeCp)_3$ and $Er(IpCp)_3$".

Journal of Crystal Growth 93 (1988) pp. 583–588 K. Uwai, H. Nakagome, and K. Takahei "Growth of Erbium–Doped GaAs and InP By Metalorganic Chemical Vapor Deposition Using $Er(CH_3C_5H_4)_3$ and $Er(C_5H_5)_3$".

Favennec, et al.; "Optical Activation of $Er^{3+}$ Implanted in Silicon by Oxygen Impurities"; *Japanese Journal of Applied Physics*, vol. 29, No. 4, Apr., 1990. pp. L524–L526.

Meyerson, B.; "Low–Temperature Si and Si:Ge Epitaxy by Ultrahigh–Vacuum/Chemical Vapor Deposition: Process Fundamentals"; *IBM Journal of Research and Development*, vol. 34, No. 6, Nov., 1990. pp. 806–815.

Beach, et al.; "Erbium–Doped Silicon Prepared by UHV/CVD"; Chemical Perspectives on Microelectronic Materials III Symposium; Nov. 30–Dec. 3, 1992, Boston, MA; pp. 397–403.

Rogers et al.; "Growth of ER Doped Si Films by Electron Cyclotron Resonance Plasma Enhanced Chemical Vapor Deposition"; Rare Earth Doped Semiconductor Symposium; San Francisco, CA; Apr. 13–15, 1993; pp. 49–54.

SUPERSATURATED RARE EARTH DOPED SEMICONDUCTOR LAYERS BY CHEMICAL VAPOR DEPOSITION

This application is a division, of application Ser. No. 08/207,942, filed Mar. 9, 1994, now U.S. Pat. No. 5,534,079 which is a division of application Ser. No. 07/940,416, filed Aug. 31, 1992, U.S. Pat. No. 5,322,813.

TECHNICAL FIELD

The invention relates to a CVD process for producing a rare earth-doped, epitaxial semiconductor layer on a substrate utilizing a silane or germane and a rare earth compound in the gas phase. By this method single phase, rare earth-doped semiconductor layers, supersaturated in the rare earth, are produced. The process may be used to produce optoelectronic devices comprising a silicon substrate and an erbium-doped epitaxial silicon film.

BACKGROUND ART

In recent years increasing research has been focused on the realization of optoelectronic integrated circuits (OE-ICs) on silicon. Possible applications would be chip-to-chip interconnects, parallel processing and the integration of photonics on silicon chips. While the first two applications require basically a light source and a detector on silicon, operating above 77K, the last application requires the operation of the light source at a certain wavelength, i.e., about 1.5 μm, which falls in the absorption minimum of optical fibers.

In 1983 Ennen et al. [*Appl. Phys. Lett.* 43, 943 (1983)] pointed out the potential of rare-earth ions in semiconductor materials for the development of light-emitting diodes and lasers. One of the most promising candidates for the preparation of these devices is erbium doping of silicon. The 1.54 μm luminescence of erbium is below the band gap of silicon, thus allowing the construction of optical wave guides within the silicon. This property presents exciting possibilities for creating optical devices in silicon and for integrating electrical and optical devices in circuits fabricated in silicon. The mature manufacturing technology of silicon can be extended into optical communications by this path as the limitation of the silicon indirect band gap is overcome. This wavelength is also becoming extremely important in optical communication because it corresponds to a transmission maximum in optical fibers and is also the output wavelength IR-pumped Er-doped silica optical amplifiers.

The 1.54 μm luminescence of erbium is the result of an internal 4f transition. The 5s and 5p shells shield the 4f orbitals of the $Er^{3+}$ from first-order host lattice effects, and, thus, luminescence is fairly independent of the host materials. The optical transitions occur between the spin-orbit levels, $^4I_{13/2} \rightarrow {}^4I_{15/2}$, of $Er^{3+}$ ($4f^{11}$). Since the influence of the crystal field of the host lattice is weak, erbium as an impurity in silicon is expected to show luminescence at room temperature.

Within the past decade, the photo- and electroluminescence, electrical characteristics, and structural properties of Er-doped silicon have been studied. However, prior to the present invention, all Er-doped silicon layers had to be prepared by ion implantation of bulk silicon or by low energy ion implantation of MBE grown silicon. After implantation, samples were annealed to both remove ion damage and to "activate" the implanted erbium. (Activate in the sense of possibly forming an Er-impurity complex which acts as the optical center in these materials.) The best results were obtained at annealing temperatures of 900° C. Unfortunately, erbium possesses a solubility limit in Si of about $1.3 \times 10^{18}$ atom/cm$^3$ at 900° C., and annealing results in the formation of platelets of $ErSi_2$ which precipitate out within the silicon phase if the concentration of Er is higher than $1.3 \times 10^{18}$.

Since higher levels of incorporation of rare earth into epitaxial silicon layers would provide more efficient and powerful devices, there is a need for a process which would produce levels of incorporation above the present limit of solubility at 900° C.

DISCLOSURE OF INVENTION

We have found that by avoiding the requirement for high temperature annealing and taking advantage of the non-equilibrium nature of chemical vapor deposition (CVD), it is possible to exceed the equilibrium concentration of dopants to produce metastable, highly doped materials. Thus, ultra high vacuum chemical vapor deposition (UHVCVD) is used to deposit erbium-doped silicon with an erbium doping level of about $2 \times 10^{19}$ atoms/cm$^3$, an order of magnitude above the equilibrium solid solubility of erbium in silicon.

It is an object of the present invention to provide a process for producing high levels of incorporation of rare earths, particularly erbium, into epitaxial silicon layers.

It is a further object to provide a process for producing germanium layers containing high levels of erbium.

It is a further object to provide optoelectronic devices having improved output and efficiency.

These and other objects and features are realized in the present invention which relates to a process for creating an erbium-doped semiconductor layer on a substrate comprising introducing into a CVD chamber, a mixture of a first component chosen from germanes, silanes or mixtures thereof in the gas phase and a second component consisting of an erbium compound in the gas phase and heating the substrate, whereby a deposition film is formed on the substrate. The erbium compound has a vapor pressure greater than $10^{-6}$ torr at 500° C. In a preferred process a source of oxygen atoms, which may be external (such as NO) or may be the rare earth ligand itself, is provided whereby the resulting silicon or germanium layer comprises erbium and oxygen, in addition to the semiconductor. When the precursor is chosen to include the source of oxygen, preferred precursors are tris(1,1,1,5,5,5-hexafluoro-2,4-pentanedionato-O,O') erbium, tris(2,4-pentanedionato-0,0') erbium, tris (1,1,1-trifluoropentanedionato-0,0')erbium, tris (1,1,1-trifluoro-5,5-dimethyl-2,4-hexanedionato-0,0') erbium, tris(5,5-dimethyl-2,4-hexanedionato-0,0')erbium, tris(1-cyclopropyl-4,4,4-trifluoro-1,3-butanedionato-0,0') erbium, tris(2,2,6-trimethyl-3,5-heptanedionato-0,0') erbium, tris(2,2,6,6-tetramethyl-3,5-heptanedionato-0,0') erbium, tris(1,1,1,5,5,6,6,7,7,7-decafluoro-2,4-heptanedionato-0,0')erbium, 2,2-dimethyl-6,6,7,7,8,8,8-heptafluoro-3,5 -octanedionato)erbium and tris[(2-phenyliminomethyl)phenolato-O,N]erbium. When the source of oxygen atoms is external, such as nitrous oxide, preferred precursors are tris(cyclopentadienyl)erbium, tris (pentamethylcyclopentadienyl)erbium, tris (methylcyclopentadienyl)erbium, tris (isopropylcyclopentadienyl)erbium, bis(cyclopentadienyl) erbium halides, and bis(cyclopentadienyl)erbium alkyls.

In a particularly preferred process the silane or germane is $SiH_4$, the erbium compound is tris(1,1,1,5,5,5-hexafluoro-2,4-pentanedionato-0,0') erbium[Er(HFAC)$_3$], and the erbium-doped semiconductor layer contains more than $10^{19}$ atoms/cm$^3$ of erbium and additionally at least $10^{18}$ atoms/ cm$^3$ of oxygen. The substrate is heated at 450° to 800° C., preferably at about 650° C. and the pressure is maintained at from 10 to 10$^{-9}$ torr. The silane is provided at a flow rate of 1 to 100 sccm, preferably at about 4 sccm when the temperature is 650°.

In another aspect, the invention relates to an optically active epitaxial film comprising silicon and from about 8×10$^{18}$ to about 8×10$^{19}$ atoms/cm$^3$ of erbium, preferably including from 10$^{17}$ to 10$^{19}$ atoms/cm$^3$ of oxygen, said film being substantially free of erbium silicide precipitates.

In another aspect, the invention relates to an optoelectronic device comprising a silicon substrate and an epitaxial silicon film adherent thereon, said film containing from about 8×10$^{18}$ to about 8×10$^{19}$ atoms/cm$^3$ of erbium and said epitaxial film being substantially free of erbium silicide precipitates.

In yet a further aspect, the invention relates to a chemical vapor deposition process for creating a rare earth-doped silicon layer on a substrate comprising depositing said layer by the thermal decomposition of a gaseous precursor mixture of a silane and a rare earth compound. According to the process the rare earth-doped silicon layer may contain the rare earth element in substantially a single phase at a concentration which is higher than the equilibrium concentration for a single phase of that rare earth in silicon. Preferably the gaseous precursor mixture additionally comprises a source of oxygen atoms, which can be the rare earth compound itself. The rare earth compound is preferably chosen from the group consisting of hexafluoroacetylacetonate, acetylacetonates, tetramethylheptanedionates and fluorooctanedionates, and the rare earth is chosen from the group consisting of erbium, terbium and europium.

BEST MODE FOR CARRYING OUT THE INVENTION

Figure 1:
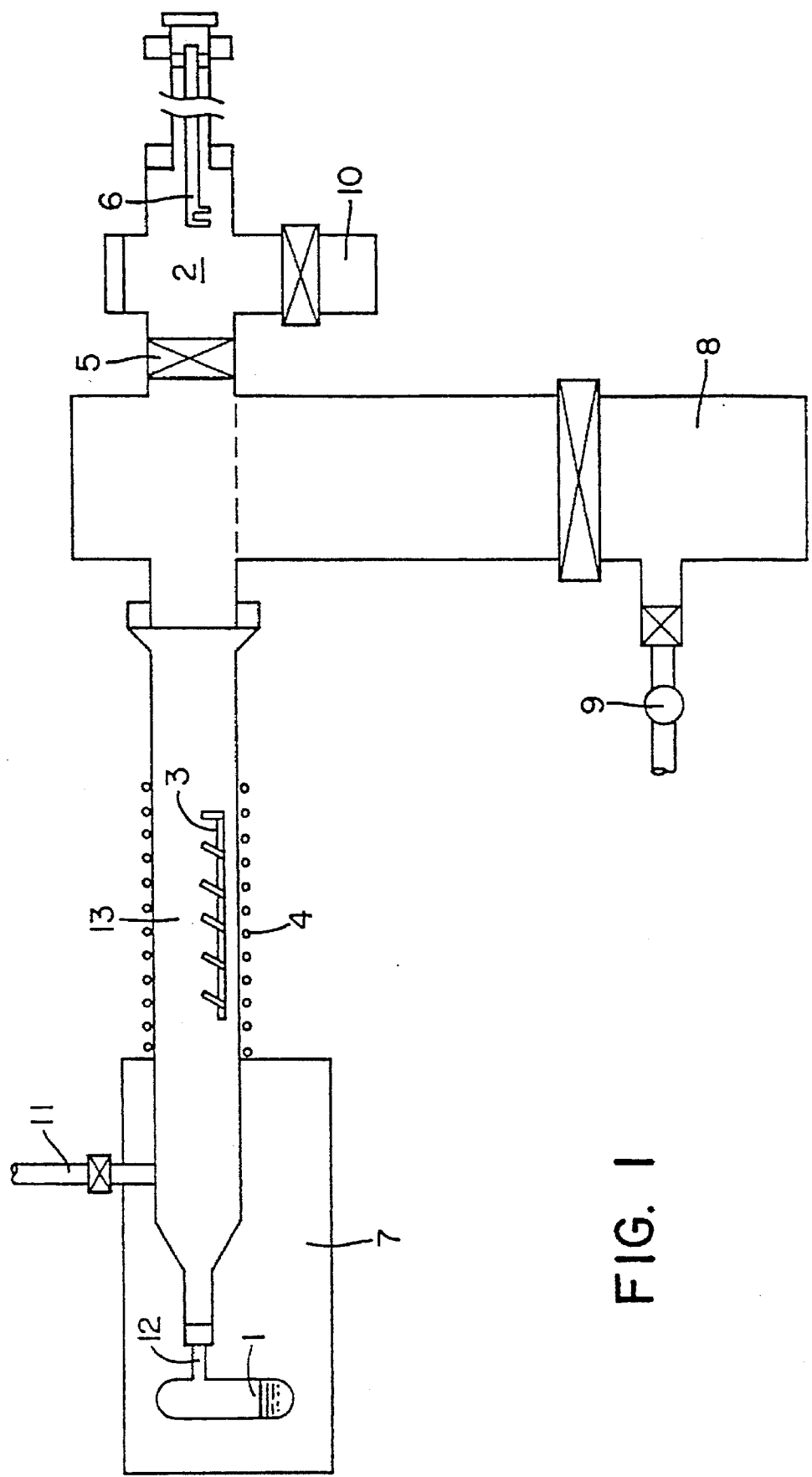
FIG. 1 is a schematic representation of an ultra high vacuum CVD apparatus useful in the practice of the invention.

A 7.6 cm diameter ultra high vacuum chemical vapor deposition (UHVCVD) reactor useful for the preparation of films of the invention is depicted in FIG. 1. The reactor differs in design from the original UHVCVD reactor described by Meyerson et al. in that pumping and wafer loading are done using the same end of the reactor. This modification allows the installation of a heated precursor reservoir 1 on the opposite end of the reactor. The reservoir is connected to the reactor end flange using a short length of 12.7 mm diameter stainless steel tubing 12. The reactor is constructed of quartz glass and stainless steel, using flanges, valves and seals common to the construction of high vacuum apparatus. The reactor is heated by external resistive heating (tube furnace 4). The reactor is pumped both before and during deposition by a 150 L/sec turbomolecular pump 8 backed by a two-stage oil pump 9. The load lock chamber is also pumped by a turbomolecular pump 10 to prevent contamination from pump oil. The base pressure of the reactor is below 10$^{-9}$ torr and the load lock is capable of producing pressures below 10$^{-6}$ torr from atmospheric pressure in less than 10 minutes.

According to the process of the invention the precursor reservoir 1 is charged with an appropriate amount of the rare earth compound and evacuated. In a preferred embodiment, the rare earth is erbium, although other rare earths, particularly terbium and europium may also be used. The rare earths include elements 57 to 71. The rare earth compounds are restricted in that they must be able to provide a vapor for the CVD process at the temperatures and pressures at which CVD can be run. In a practical sense this means that the rare earth compound should exhibit a vapor pressure of at least about 10$^{-6}$ torr at 500° C. Exemplary compounds fall into two broad categories:

(a) coordination compounds, where the rare earth is bound to oxygen, nitrogen, sulfur or phosphorus, and (b) organometallic compounds, where the rare earth is bound to carbon atoms. Suitable ligands for the coordination compounds include: acetylacetonate (2,4-pentanedionate) and derivatives of acetylacetonate including hexafluoroacetylacetonate (HFAC, 1,1,1,5,5,5-hexafluoro-2,4-pentanedionate) and trifluoroacetylacetonate (TFAC, 1,1,1-trifluoro-2,4-pentanedionate); 2,4-hexanedionate and derivatives of 2,4-hexanedionate; 2,4- and 3,5-heptanedionate and derivatives including 2,2,6,6-tetramethyl-3,5-heptanedionate (THD), 2,2,6-trimethyl-3,5-heptanedionate, and 1,1,1,5,5,6,6,7,7,7-decafluoro 2,4 heptanedionate; 2,2-dimethyl-6,6,7,7,8,8,8-heptafluoro-3,5-octanedionate(FOD); and Schiff-base type complexes such as the condensation product of aniline and 2-hydroxybenzaldehyde, which give a bidentate ligand binding through nitrogen and oxygen. Examples of organometallic compounds include tris-cyclopentadienyl erbium (III) and organic derivatives of the cyclopentadienyl ring including the tris-pentamethylcyclopentadienyl ligand, the methylcyclopentadienyl ligand, and the isopropylcyclopentadienyl ligand, bis(cyclopentadienyl) erbium halides, and bis(cyclopentadienyl)erbium alkyls, wherein alkyl is defined as a linear or branched hydrocarbon radical of one to six carbon atoms. Preferred ligands include acetylacetonate, HFAC, THD and FOD.

From the literature it appears that the inclusion of oxygen (and perhaps carbon, nitrogen and fluorine as well) along with erbium gives rise to enhanced photoluminescence. For this reason it is desirable to provide a source of oxygen for the CVD film. This can be achieved either by introducing a gaseous source of oxygen, such as nitrous oxide, or by using a precursor compound that contains oxygen, such as the ligands discussed above. In either case, when the precursor is thermally decomposed on the substrate, a film containing both rare earth atoms and oxygen (or other "impurity" atoms) will be deposited.

The substrate is loaded onto the quartz wafer boat 3, placed in the load-lock chamber 2 and evacuated to a suitable pressure, preferably less than 10$^{-5}$ torr. The substrate can be any material that is compatible with the CVD conditions; single-crystal silicon wafers are preferred. In general, a better film is produced when the substrate wafer has been previously cleaned in the usual manner.

A precursor gas for the semiconductor film is introduced into the reactor. The precursor can be any silane or germane or mixture of the two that is volatile under the conditions of CVD; silane (SiH$_4$), disilane (Si$_2$H$_6$), germane (GeH$_4$) and digermane (Ge$_2$H$_6$) are preferred. Group III dopant precursors, such as diborane, or group V dopant precursors, such as phosphine, may be introduced to alter the electrical properties of the films. The semiconductor precursor gases are introduced via gas inlet 11 into the reactor.

The temperature of the reactor is maintained at 450° to 800° C. Below 450° epitaxial growth of Si, Ge, or Si/Ge is not observed; as 900° C. is approached, erbium begins to segregate. The pressure in the load-lock chamber 2 before introducing the substrate into the reactor is preferably below $10^{-5}$ torr.

After the substrate is moved through the gate valve 5 into the reactor chamber 13 by the magnetically coupled manipulator 6, the rare earth precursor is vaporized into the reaction chamber from the reservoir 1 by applying heat. In the embodiment shown in FIG. 1 the heat is supplied by an external oven 7 surrounding the reservoir. In the case of $Er(HFAC)_3$, the optimal rate of vaporization is obtained when the oven is held at 58° C. Regulation of the precursor reservoir temperature, and hence regulation of the partial pressure of precursor in the reactor, is important to the success of the process. In the case of $Er(HFAC)_3$, at temperatures below 55° C., no erbium was incorporated. Above 65° C., the films consisted of a polycrystalline layer 300 to 400 Å thick with a concentration of erbium of 10 to 20%. The thickness of this layer did not increase with longer deposition times, indicating that the growth surface was "poisoned" by the precursor. The likely explanation for this observation is that there is a minimum growth rate above which the erbium and other elements from the precursor may be incorporated and below which the growth surface is poisoned. (The growth rate of pure silicon from silane at 1 mtorr pressure is 4 Å/min at 550° C. and 40 Å/min at 650° C.) The selection of the appropriate oven temperature for a given rare earth compound is readily determined empirically as part of the routine adjustment of experimental conditions. Reasonable temperatures can be calculated by comparison of the vapor pressure of the precursor of interest at the pressure of the reservoir with the vapor pressure of $Er(HFAC)_3$ at 58°/1 torr.

Figure 3:
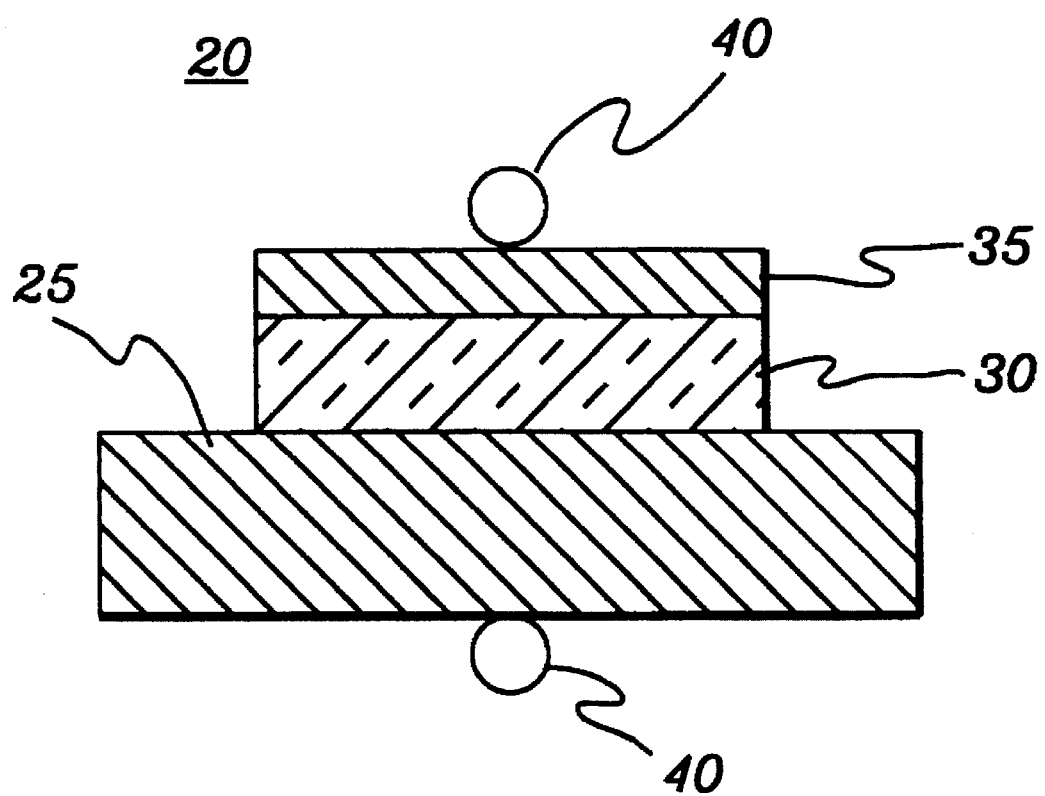
FIG. 3 is a cross-sectional view of a prior art photoelectronic device comprising erbium-doped silicon.

FIG. 3 illustrates a known photoelectronic device disclosed by Luth et al. in U.S. Pat. No. 5,248,890. Device 20 is a light emitting diode comprising a semiconductor substrate 25, preferably a silicon wafer, an insulator layer 30, which is preferably a rare earth doped metal fluoride, a metal film 35 which serves as an electrode, and a contact 40 which is bonded to the electrode by soldering, and a second contact 40 provided on semiconductor substrate 25 by conventional means. Insulator layer 30 is preferably doped with 1 to 10 atomic percent neodymium or erbium. In the optoelectronic device of the present invention insulator layer 30 is replaced with a semiconductor film containing about $8 \times 10^{18}$ to $8 \times 10^{19}$ atoms/cm$^3$ of a rare earth element. The film 30 is also substantially free of rare earth semiconductor precipitates. In the preferred embodiment substrate 25 is single crystal silicon and the rare earth element is erbium such that film 30 is substantially free of erbium silicide precipitates.

Experimental Results

The precursor reservoir was charged with 1.0 g of anhydrous tris(hexafluoroacetylacetonato-0,0') erbium (III) and evacuated. Four 2.25 inch diameter Si wafers which had previously been cleaned and dipped in 10% hydrofluoric acid until the surface became hydrophobic were immediately placed in the reactor load-lock. The flow of silane (4 sccm) and hydrogen (50 sccm) was started, and the valve to the room-temperature erbium source was opened. After a ten minute pump down in the load-lock the wafers were transferred to the reactor. Three minutes after loading, the flow of hydrogen was stopped and the temperature of the reactor was increased from 500° C. to 650° C. over a period of one hour. With the reactor at 650° C., the temperature of the oven surrounding the precursor was increased to 58° C., directly subliming $Er(HFAC)_3$ into the reactor. The pressure during deposition was 1.5 mtorr, giving a calculated system pumping speed of 42 L/sec. The deposition rate under these conditions was approximately 30 Å/min and deposition times varied from 3 to 12 hours. The flow of silane was discontinued, and the wafers were withdrawn to the load-lock chamber to cool.

The composition of the films was determined using Rutherford Back Scattering spectroscopy (RBS) to determine the erbium concentration and Secondary Ion Mass Spectroscopy (SIMS) to determine the level of carbon, fluorine and oxygen present in the films. Films produced under the conditions described above (evaporator temperature $(T_e)$= 58° C., substrate temperature $(T_s)$=650° C.) had a uniform erbium concentration of $2 \times 10^{19}$ atoms/cm$^2$ with carbon, fluorine and oxygen levels of approximately $4 \times 10^{19}$ atoms/cm$^3$. The carbon, oxygen, and fluorine levels were equal in the three samples measured, within the uncertainty of the measurement. These "impurities" arise from the decomposition of the precursor.

Transmission Electron Microscopy (TEM) was performed on two of the samples. Sample 1 was a 2.7 μm thick film ($T_e$ =60° C., $T_s$ =650° C., Er concentration=$8 \times 10^{19}$ atoms/cm$^3$) deposited on Si(100). Electron diffraction indicated that the film was epitaxial but also showed the presence of a second phase readily assignable as $ErSi_2$. The corresponding electron image indicated the crystal quality of the layer was extremely poor. Sample 2 was a 2 μm thick film produced by lowering $T_e$ by 2° C. and growing for longer time (11 h instead of 3 h). The cross sectional TEM of this film does not show any precipitated $ErSi_2$. The erbium concentration of sample 2 was $2 \times 10^{19}$ atoms/cm$^3$. This level is at least one order of magnitude higher than the highest concentrations reported using implantation techniques. The cross-sectional TEM also shows a high density of threading defects. These defects may be due to stress caused by the introduction of erbium (or erbium complexes) into the film, but it is more likely that these defects are due to contamination from the precursor. At the temperatures used in UHVCVD, the crystal quality is very sensitive to the presence of carbon and oxygen and the SIMS results indicate that these elements are present in relatively high concentrations. One other possible source of contamination is residual carbon and oxygen from the decomposition of the ligand upstream from the deposition zone. The $Er(HFAC)_3$ complex decomposes in parts of the reactor which are as much as 300° C. cooler and may continue to evolve small quantities of organic material which may contaminate the initial growth surface. Support for this hypothesis is given by TEM which shows that the defects occur abruptly and at highest concentration at the initial growth interface. In this respect there may be an advantage to other precursors, particularly of the organometallic type, when used together with controlled levels of oxidant gas.

Rare earth compounds can be prepared by methods well known in the art. The $Er(HFAC)_3$ used in the foregoing experiment was made by a modification of the known process for the synthesis of $Al(HFAC)_3$ described by Morris et al. in *Inorganic Syntheses*, Vol. 9, S. Y. Tyree, editor; McGraw Hill, New York, (1967) p. 39. This synthesis is an improvement over the synthesis of $Er(HFAC)_3$ described by Berg and Acosta [*Anal. Chim. Acta*, 40, 101, (1968)] in that it is carried out under nonaqueous conditions; it thus avoids the intermediate synthesis of $Er(HFAC)_3$ monohydrate which must be dehydrated over phosphorus pentoxide under vacuum at elevated temperatures before it can be used in a CVD process. The new synthesis is also considerably faster and easier than the literature preparation, which yields a difficult to handle mixture of crystals and oil requiring several recrystallizations with significant loss of product at each step. All manipulations were carried out under nitrogen using standard Schlenk-line and dry-box techniques.

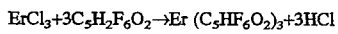

A 200 mL, three-neck flask equipped with a reflux condenser, pressure-equalizing dropping funnel, and gas inlet was charged with 4.11 g (0.015 mol) of anhydrous $ErCl_3$ in 100 mL of a $CCl_4$. To the stirred suspension was added 9.57 g (0.046 mol) of 1,1,1,5,5,5-hexafluoro-2,4-pentanedione. After several minutes, the solution turned from colorless to faint pink and HCl gas was evolved. Following the addition of the ligand, the solution was refluxed for 1 hour. The hot solution was suction filtered and cooled to −10° C. for 6 hours. Pink crystals were observed to form in the flask. The crystals were filtered, washed with cold $CCl_4$ and sublimed twice at 100° C. at $10^{-2}$ torr. A yield of 7.9 g (67%) of pure $Er(HFAC)_3$ was obtained.

It is contemplated that the foregoing synthesis could be used in similar fashion to prepare other complexes with other rare earths by substituting the appropriate rare earth trichloride for $ErCl_3$ and the appropriate ligand for HFAC.

Figure 2:
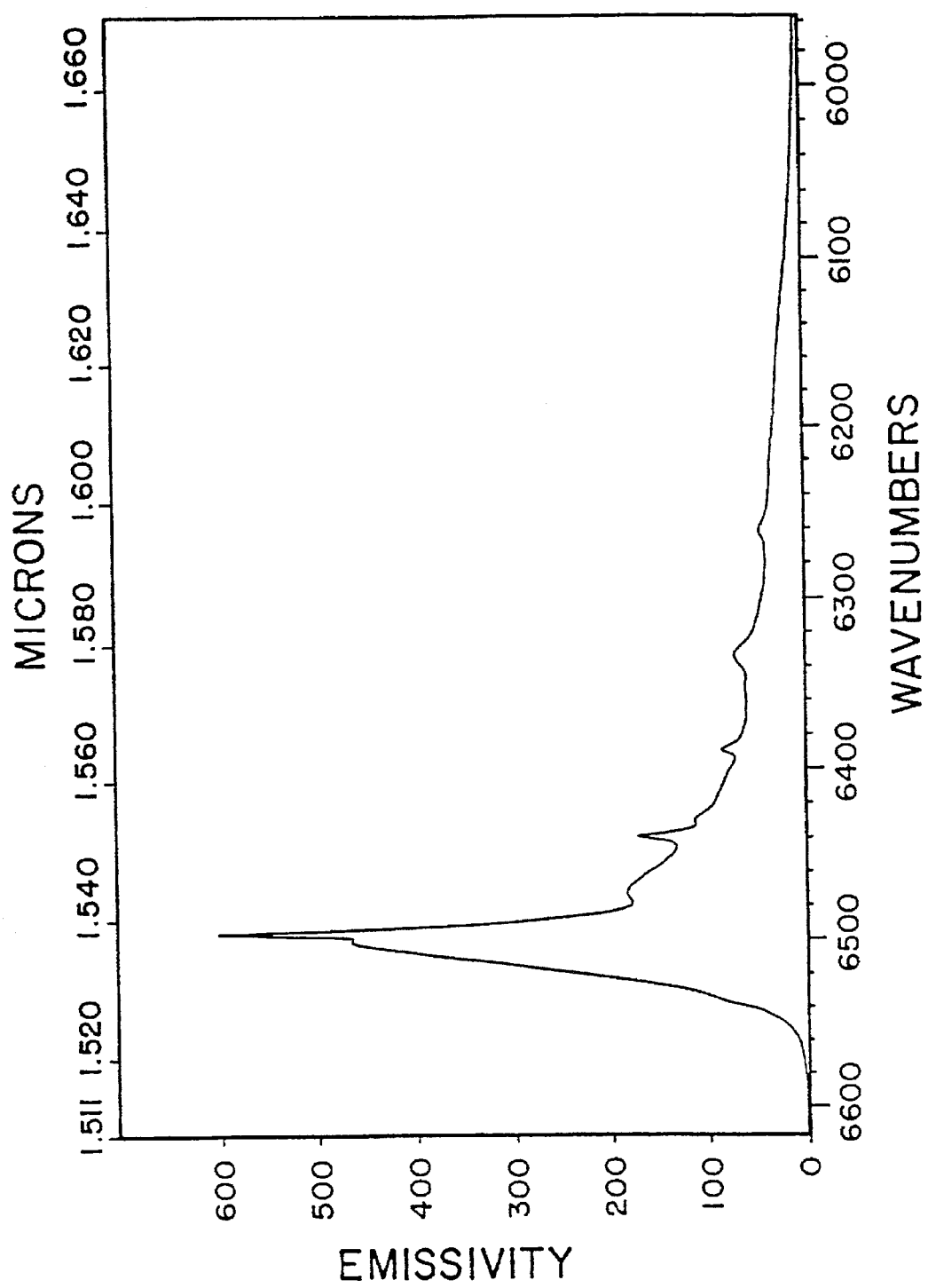
FIG. 2 is an IR spectrum of the photoluminescent output of a device of the invention.

Photoluminescence measurements were carried out on several of the samples. Measurements were done using an Ar ion laser operating at 514 nm as the excitation source and a Cygnus FTIR to detect the emitted radiation. A representative spectrum of a 2 μm film with an Er concentration of $2 \times 10^{19}$ atoms/cm³ (identical to the sample used for TEM measurements above) is shown in FIG. 2. This spectrum was obtained at 10K and the luminescence fell sharply as the temperature was raised. At 200K, the signal intensity was down by a factor of 50 and was not observable at room temperature.

While the invention has been particularly shown and described with reference to preferred embodiments thereof, it will be understood by those skilled in the art that other changes in form and details may be made therein without departing from the spirit and scope of the invention.

I claim:

1. An optoelectronic device comprising a substrate and an epitaxial semiconductor film adherent thereon, said semiconductor film comprising a semiconductor and erbium in substantially a single phase at a concentration which is higher than the equilibrium concentration for a single phase of said erbium in said semiconductor layer, said semiconductor being selected from the group consisting of silicon and mixtures of silicon and germanium, said film containing from about $8 \times 10^{18}$ to about $8 \times 10^{19}$ atoms/cm³ of erbium and said film being substantially free of erbium silicide and erbium germanide precipitates and electrically degrading defects.

2. The optoelectronic device according to claim 1, wherein said substrate comprises a single crystal silicon wafer.

3. The optoelectronic device according to claim 1, wherein said film further comprises from about $10^{17}$ to about $10^{19}$ atoms/cm³ of oxygen.

4. The optoelectronic device according to claim 1, wherein said film further comprises from about $10^{17}$ to about $10^{19}$ atoms/cm³ of fluorine.

5. The optoelectronic device according to claim 1, wherein said film further comprises from about $10^{17}$ to about $10^{19}$ atoms/cm³ of carbon.

* * * * *